(12) United States Patent
Wang et al.

(10) Patent No.: US 7,301,486 B2
(45) Date of Patent: Nov. 27, 2007

(54) TIME-INTERLEAVED ANALOG-TO-DIGITAL CONVERTER HAVING TIMING CALIBRATION

(75) Inventors: Chung-Yi Wang, Fongyuan (TW); Jieh-Tsorng Wu, Hsinchu (TW)

(73) Assignee: National Chiao Tung University, Hsinchu (TW)

( * ) Notice: Subject to any disclaimer, the term of this patent is extended or adjusted under 35 U.S.C. 154(b) by 0 days.

(21) Appl. No.: 11/478,679

(22) Filed: Jul. 3, 2006

(65) Prior Publication Data

US 2007/0194960 A1    Aug. 23, 2007

(30) Foreign Application Priority Data

Feb. 23, 2006  (TW) .................................. 9510618 A

(51) Int. Cl.
*H03M 1/06* (2006.01)
(52) U.S. Cl. ...................................... 341/118; 341/155
(58) Field of Classification Search ................ 341/118, 341/120, 155, 122, 141
See application file for complete search history.

(56) References Cited

U.S. PATENT DOCUMENTS

| 5,294,926 | A | 3/1994 | Corcoran | 341/120 |
|---|---|---|---|---|
| 6,522,282 | B1 * | 2/2003 | Elbornsson | 341/155 |
| 6,545,626 | B1 * | 4/2003 | Nakada | 341/155 |
| 7,084,793 | B2 * | 8/2006 | Elbornsson | 341/118 |
| 7,151,917 | B2 * | 12/2006 | Paulus | 455/302 |
| 7,158,586 | B2 * | 1/2007 | Husted | 375/324 |
| 7,227,479 | B1 * | 6/2007 | Chen et al. | 341/118 |

\* cited by examiner

*Primary Examiner*—Peguy JeanPierre
(74) *Attorney, Agent, or Firm*—Troxell Law Office, PLLC

(57) ABSTRACT

An analog-to-digital converter (ADC) having a two-channel or multi-channel structure processes background timing calibration. Signals from the ADC are directly compared for the calibration. Additional signal or interruption of circuit is not required. A dynamic calibration is processed. A timing-skew error is kept in a low level and a process mismatch is not a concern. Moreover, sampling frequency and input signal frequency are improved. A high sampling frequency and a high speed of signal inputting are achieved; and chip area can be greatly shrunk because the extra calibration circuits are simple digital circuits.

19 Claims, 2 Drawing Sheets

TIME-INTERLEAVED ANALOG-TO-DIGITAL CONVERTER HAVING TIMING CALIBRATION

FIELD OF THE INVENTION

Figure 1:
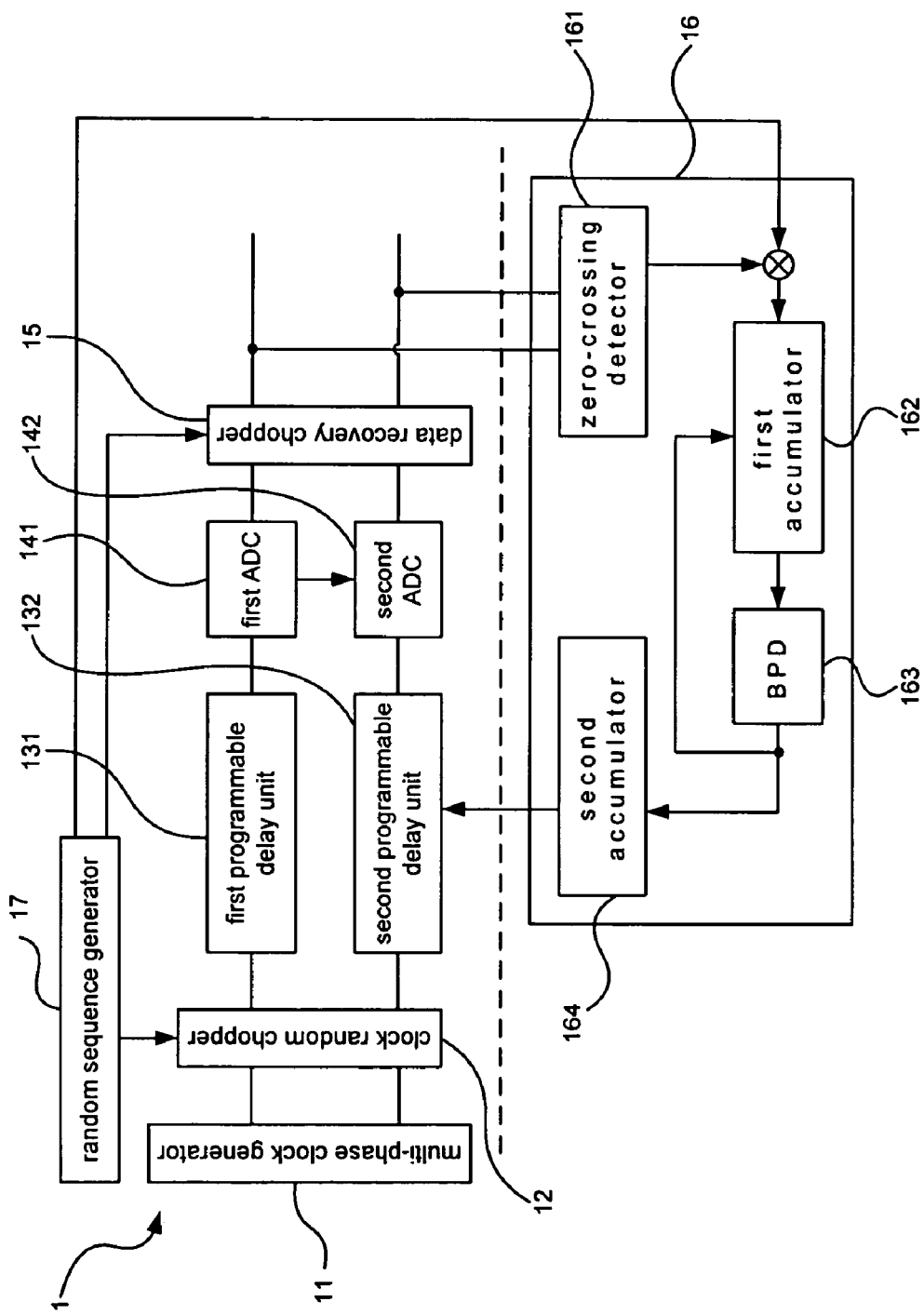

The present invention relates to an analog-to-digital converter; more particularly, relates to dynamically calibrating timing of narrow-band signals and wide-band signals in a successive circulation by using a two-channel or multi-channel time-interleaved analog-to-digital converter having background timing calibration without interruption of circuit.

DESCRIPTION OF THE RELATED ARTS

General timing-skew calibrations for a time-interleaved analog-to-digital converter includes the following method.

a. Foreground calibration method: Before running the circuit, a standard input signal is generated as a calibration authority for a calibration of timing-skew error of each various phase. But, because timing skew will slightly changes with the temperature and the outside environment on running the circuit, a main disadvantage of this method is that a dynamic calibration of timing-skew error is not available and the converter becomes inferior after a period of operation.

b. Correction of cross-correlation function test: In a multi-channel ADC, timing-skew information are obtained by comparing cross-correlation functions of each two channels. When there is a timing skew in a phase, the cross-correlation functions of two channels are different in the multi-channel ADC and so a timing-skew error can be known. But this method can only be applied in a narrow-bandwidth operation. When the bandwidth of the input signal is wider than a half of the sampling frequency of a single channel, signal aliasing appears and fails this method.

In U.S. Pat. No. 5,294,926, "Timing and amplitude error estimation for time-interleaved analog-to-digital converters", a pre-calibration is processed. When a reference sine-wave signal is inputted into a time-interleaved analog-to-digital converter, a timing position of zero crossing is found by digital interpolation. Time periods of each two adjacent channels are compared and the differences are expressed in digital signals. When digital signals are different, a timing skew is determined and a timing-skew calibration is done according to the information. This method separates the signals and the sine waves and, so, is a foreground calibration method.

Although the above methods processes timing-skew calibrations, the foreground calibration method is not able to process a calibration dynamically and the correction of cross-correlation function test can be applied to narrow band signals only. Hence, the prior arts do not fulfill users' requests on actual use.

SUMMARY OF THE INVENTION

The main purpose of the present invention is to dynamically calibrate timing of both narrow-band signals and wide-band signals in a successive circulation with out interruption of circuit while maintaining smallest timing-skew error.

To achieve the above purpose, the present invention is a time-interleaved analog-to-digital converter having a timing calibration, which is a two-channel or multi-channel time-interleaved analog-to-digital converter. The two-channel background calibrated time-interleaved analog-to-digital converter comprises a multi-phase clock generator, a clock random chopper, a first programmable delay unit, a second programmable delay unit, a first ADC, a second ADC, a data recovery chopper, a CP and a random sequence generator. The multi-channel time-interleaved analog-to-digital converter comprises a multi-phase clock generator, a multi-channel clock random chopper, a multi-channel programmable delay unit, a multi-channel analog-to-digital converter, a multi-channel data recovery chopper, a multi-channel CP and a random sequence generator. Accordingly, a novel time-interleaved analog-to-digital converter having a timing calibration is obtained.

BRIEF DESCRIPTIONS OF THE DRAWINGS

Figure 2:
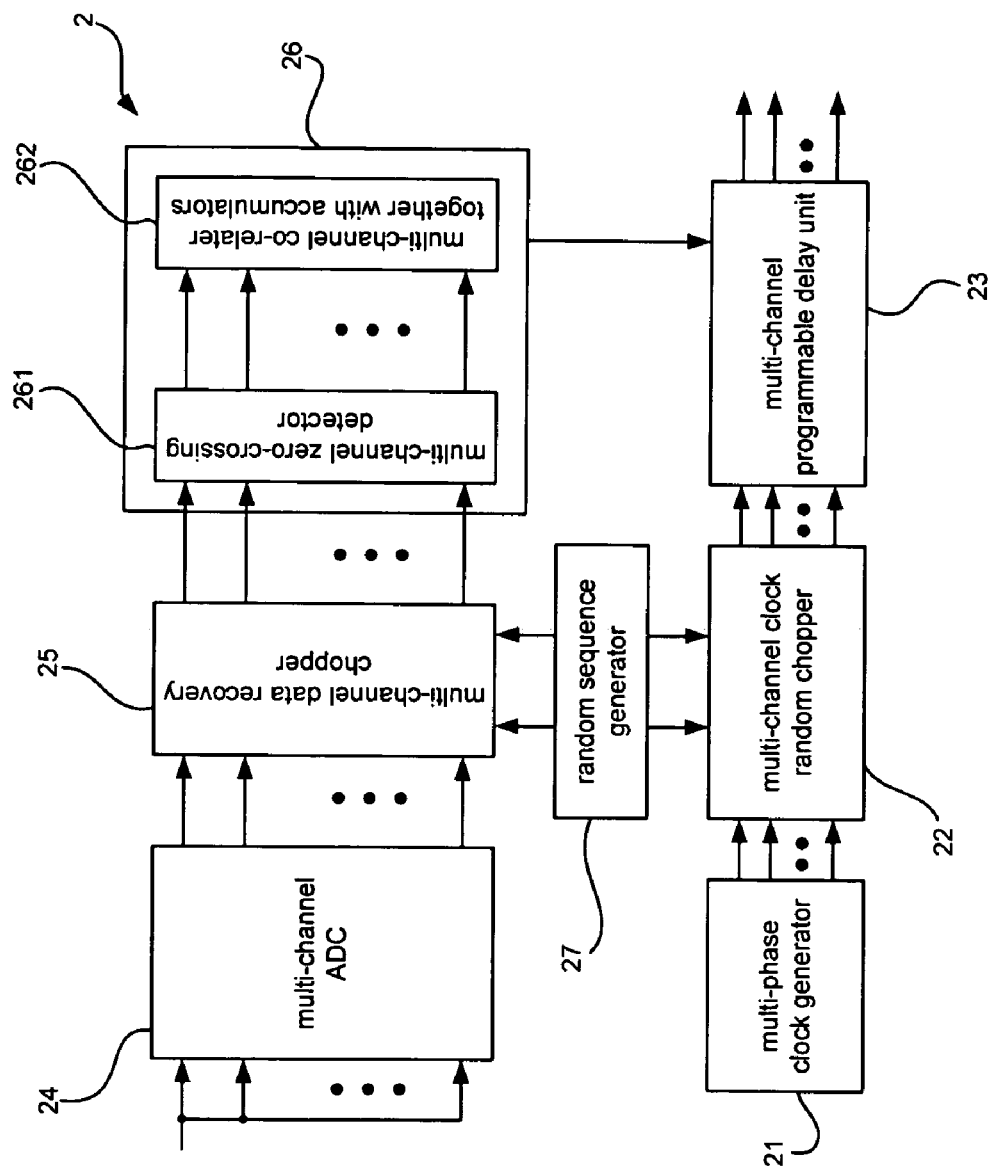

The present invention will be better understood from the following detailed descriptions of the preferred embodiments according to the present invention, taken in conjunction with the accompanying drawings, in which FIG. 1 is a structural view showing the first preferred embodiment according to the present invention; and FIG. 2 is a structural view showing the second preferred embodiment.

DESCRIPTION OF THE PREFERRED EMBODIMENTS

The following descriptions of the preferred embodiments are provided to understand the features and the structures of the present invention.

Please refer to FIG. 1, which is a structural view showing a first preferred embodiment according to the present invention. As shown in the figure, the present invention is a time-interleaved analog-to-digital converter (ADC) having a timing calibration. The first embodiment is a two-channel background calibrated time-interleaved ADC 1, comprising a multi-phase clock generator 11, a clock random chopper 12, a first programmable delay unit 131, a second programmable delay unit 132, a first ADC 141, a second ADC 142, a data recovery chopper 15, a calibration processor 16 (CP) and a random sequence generator 17.

Therein, the CP 16 comprises a zero-crossing detector 161, a first accumulator 162, a bilateral peak detector (BPD) 163 and a second accumulator 164. The first accumulator 162 can be a flexible-symbol accumulator; or, the first accumulator 162 and the second accumulator 164 can be replaced with a counter.

When using the first preferred embodiment, the multi-phase clock generator 11 provides a first phase and a second phase to the clock random chopper 12 for a timing change. The random sequence generator 17 outputs a random signal to the clock random chopper 12 to decide the state when the first phase and the second phase transfer to the first programmable delay unit 131 and the second programmable delay unit 132. When the random signal is 1, the state is a positive state and the first phase and the second phase are transferred to the first programmable delay unit 131 and the second programmable delay unit 132 respectively. Or, when the random signal is −1, the state is a negative state and the first phase and the second phase are transferred to the second programmable delay unit 132 and the first programmable delay unit 131 respectively. The occurrence of the positive state and negative state are 50% and 50%; and, the multi-phase clock generator 11 can be a phase-locked loop.

The CP 16 outputs a digital control signal to the second programmable delay unit 132 for a timing-skew calibration until timing differences are equal between the first programmable delay unit 131 and the second programmable delay unit 132. The first programmable delay unit 131 and the second programmable delay unit 132 generate output signals to the first ADC 141 and the second ADC 142 respectively to obtain a first digital signal and a second digital signal. The first digital signal and the second digital signal are outputted to the data recovery chopper 15 to obtain the original signal without aliasing and are transferred to the CP 16. Then signals are kept inputting with circular works.

The zero-crossing detector 161 of the CP 16 receives the first digital signal and the second digital signal from the data recovery chopper 15 to find out whether a value smaller then 0 is obtained by multiplying the first digital signal by the second digital signal; and a number of level crossings to 0 level is counted. The number of level crossings has a one-to-one mapping to a cross-correlation coefficient of the first digital signal and the second digital signal to obtain timing-skew information. Such an effect is achieved by simple logic gates without a great amount of calculations by large circuits, such as multipliers. When a number of level crossings under positive state and a number of level crossings under negative state are the same, there is no timing skew. When the number of level crossings under positive state is bigger than the number of level crossings under negative state, a timing difference of the first programmable delay unit 131 and the second programmable delay unit 132 is big and there is a positive timing-skew error. When the number of level crossings under positive state is smaller than the number of level crossings under negative state, the timing difference of the first programmable delay unit 131 and the second programmable delay unit 132 is small and there is a negative timing-skew error. Hence, the polarity of skew errors is acknowledged by the zero-crossing detector 161; and, an output signal of the zero-crossing detector 161 is multiplied by the random signal outputted from the random sequence generator to obtain a value of a related variable.

The first accumulator 162 accumulates values of the related variable to obtain the state of the timing skew. For example, when there is a positive timing-skew error, the related variable is deducted to a smaller value; on the contrary, when there is a negative timing-skew error, the related variable is added to a bigger value. Thus, the result after the accumulation of the first accumulator 162 is the value of the timing skew and shows the polarity of the skew error. The longer the duration and the bigger the number of the accumulation, the more authentic is the result. Hence, a negative feedback system is formed for processing timing-skew calibration to obtain a minimum timing skew.

The accumulated result is then inputted into the BPD 163. The BPD 163 is used to monitor the first accumulator with a decision threshold. When the accumulated result is bigger than the decision threshold, the BPD 163 outputs a signal with +1 value; when the accumulated result is smaller than the decision threshold, the BPD 163 outputs a signal with −1 value; and, the BPD 163 outputs a signal with 0 value when outside of the above situations. When the BPD 163 outputs a signal with a value other than 0, the first accumulator 162 is reset to zero for the next accumulation and thus the BPD 163 stays in a state of outputting a signal with a non-zero value only for a timing period to credibly obtain a polarity of a skew error.

The second accumulator 164 accumulates output signals from the BPD 163; and the accumulated result is used to control the second programmable delay unit 132 to equalize timing differences (to a default value) for the second programmable delay unit 132 and the first programmable delay unit. When the accumulated result is added by 1, the timing skew is added with a fixed ultra-low level. Yet the timing skew is not added with a fixed value, but fluctuating around zero, which is regarded as a fluctuation noise. By precisely estimating a related parameter for the two-channel background calibrated time-interleaved ADC 1, the fluctuation noise is restrained to prevent from affecting the whole performance.

Please refer to FIG. 2, which is a structural view showing a second preferred embodiment. As shown in the figure, the second embodiment is a multi-channel time-interleaved ADC 2, comprising a multi-phase clock generator 21, a multi-channel clock random chopper 22, a multi-channel programmable delay unit 23, a multi-channel ADC 24, a multi-channel data recovery chopper 25, a multi-channel CP 26 and a random sequence generator 27. Therein, the multi-channel CP 26 comprises a multi-channel zero-crossing detector 261 and a multi-channel co-relater together with accumulators 262; the multi-channel co-relater together with accumulators 262 comprises a co-relater and a plurality of accumulators; and, the accumulator is a flexible-symbol accumulator or a general accumulator. The multi-phase clock generator 21 generates a plurality of phases; and, the number of the phases, which has to be an even number, is obtained by dividing a sampling period of each ADC by a timing difference of each phase. From the number of the phases, a number of channels of the multi-channel time-interleaved ADC 2 is obtained, such as a four-channel time-interleaved ADC, a six-channel time-interleaved ADC, etc. Furthermore, the multi-channel time-interleaved ADC 2 can be used for narrow-band signals and wide-band signals, where the bandwidth of a signal has an upper limit bigger than a reciprocal of two times of the sampling period; and has a lower limit of a reciprocal of two times of the timing difference of phase. Consequently, signals in the bandwidth between the upper limit and the lower limit are calibrated by the multi-channel time-interleaved ADC 2.

When using the second preferred embodiment, the multi-phase clock generator 21 provides n phases ($\psi_i$, i=0, 1, 2 . . . N−1, N is an even number) to the multi-channel clock random chopper 22. The random sequence generator 27 outputs a first random signal and a second random signal. The first random signal determines a timing change and the second random signal determines a state from a positive state and a negative state. The multi-channel clock random chopper 22 generates output signals to the multi-channel ADC 24 to be transformed into multi-channels of signals; and the signals are recovered by the multi-channel data recovery chopper 25 to be transferred to the multi-channel CP 26.

When the first random signal is 1 and the second random signal is in a positive state, the n phases are grouped by two of a phase and an adjacent phase with a sequence of ($\psi_i$, $\psi_{i+1}$) in to ($\psi_0$, $\psi_1$), ($\psi_1$, $\psi_2$), . . . , ($\psi_i$, $\psi_{i+1}$). The multi-channel co-relater together with accumulators 262 uses a reference phase as a base and a farer phase to the reference phase is used for a calibration to obtain a timing difference to a default value between the phase $\psi_i$ and the adjacent phase $\psi_{i+1}$. On the contrary, when the second random signal is in a negative state, a group of a phase and an adjacent phase with a sequence of ($\psi_{i+1}$, $\psi_i$) is obtained and a fare r phase to the reference phase is used for a calibration to obtain a timing difference to a default value between the phase $\psi_{i+1}$ and the adjacent phase $\psi_i$.

Or, when the first random signal is 0 and the second random signal is in a positive state, the n phases are grouped by two of a phase and an adjacent phase with a sequence of $(\psi_{i-1}, \psi_i)$ into $(\psi_1, \psi_2), (\psi_2, \psi_3), \ldots, (\psi_{i-1}, \psi_i)$. The multi-channel co-relater together with accumulators 262 uses a reference phase as a base, and a farer phase to the reference phase is used for a calibration to obtain a timing difference to a default value between the phase $\psi_{i-1}$ and the adjacent phase $\psi_i$. On the contrary, when the second random signal is in a negative state, a group of a phase and an adjacent phase with a sequence of $(\psi_i, \psi_{i-1})$ is obtained and a fare r phase to the reference phase is used for a calibration to obtain a timing difference to a default value between the phase $\psi_i$ and the adjacent phase $\psi_{i-1}$.

The multi-channel zero-crossing detector 261 receives the signals from the multi-channel data recovery chopper 25 for an accumulation and a histogram of zero crossing to obtain information of phase calibration. And the multi-channel co-relater together with accumulators 262 outputs a signal to the multi-channel programmable delay unit 23 for a calibration to optimize the multi-channel time-interleaved ADC 2.

A high-pass filter can be further applied at an output of the multi-channel ADC 24 to filter offset errors in the multi-channel ADC 24. Because the multi-channel time-interleaved ADC 2 compares the polarities of skew errors only to obtain information of timing skew, the present invention is not affected by the gain errors in the ADC so that yield rate is improved with easy fabrication and a better calibration is obtained at the same time.

To sum up, the present invention is a time-interleaved ADC having a timing calibration, where only simple logic circuits are used in the present invention for narrow-band signals and wide-band signals and offset errors in ADC are restrained so that a better calibration, a dynamic calibration, is obtained without interruption of circuit.

The preferred embodiments herein disclosed are not intended to unnecessarily limit the scope of the invention. Therefore, simple modifications or variations belonging to the equivalent of the scope of the claims and the instructions disclosed herein for a patent are all within the scope of the present invention.

What is claimed is:

1. A time-interleaved analog-to-digital converter (ADC) having a timing calibration, said converter being a two-channel time-interleaved ADC, comprising:
   a calibration processor (CP);
   a multi-phase clock generator, said clock generator providing a first phase and a second phase;
   a clock random chopper, said clock random chopper receiving a phase from said clock generator to process a timing change;
   a first programmable delay unit, said first programmable delay unit receiving a first signal being processed through said timing change;
   a second programmable delay unit, said second programmable delay unit receiving a second signal being processed through said timing change, said second programmable delay unit receiving an output signal from said CP to process a timing-skew calibration;
   a first ADC, said first ADC receiving an output signal from said first programmable delay unit;
   a second ADC, said second ADC receiving an output signal from said second programmable delay unit;
   a data recovery chopper, said data recovery chopper recovering digital signals from said first ADC and said second ADC to be transferred to said CP; and
   a random sequence generator, said random sequence generator providing a random signal.

2. The ADC according to claim 1,
   wherein said CP comprises a zero-crossing detector, a first accumulator, a bilateral peak detector (BPD) and a second accumulator.

3. The ADC according to claim 2,
   wherein said first accumulator is selected from a group consisting of a flexible-symbol accumulator and a counter.

4. The ADC according to claim 2,
   wherein said first accumulator has a positive state to accumulate times of output of said zero-crossing detector.

5. The ADC according to claim 2,
   wherein said first accumulator has a negative state to inversely accumulate times of output of said zero-crossing detector.

6. The ADC according to claim 2,
   wherein said BPD outputs an output signal not equal to zero then said BPD sets said first accumulator to zero before processing an adding by said first accumulator.

7. The ADC according to claim 2,
   wherein said second accumulator is a counter.

8. The ADC according to claim 2,
   wherein said second accumulator accumulates output signals of said BPD to obtain an output;
   wherein said output of said second accumulator is selected from a group consisting of a digital adjusting signal, and a control signal to a second programmable delay unit.

9. The ADC according to claim 1,
   wherein said random signal is used to decide a state of a random sequence selected from a group consisting of a positive state and a negative state.

10. The ADC according to claim 1,
    wherein said multi-phase clock generator is a phase locked loop.

11. The ADC according to claim 1,
    wherein an output of said first ADC and an output of said second ADC are further added with a high-pass filter to filter offset error from said first ADC and said second ADC.

12. A time-interleaved ADC having a timing calibration, said ADC being a multi-channel time-interleaved ADC, comprising:
    a multi-channel CP;
    a multi-phase clock generator, said clock generator generating a plurality of phases;
    a multi-channel clock random chopper, said clock random chopper receiving a phase from said multi-phase clock generator to be processed with a timing change;
    a multi-channel ADC, said ADC transforming an output signal from said clock random chopper into a digital signal;
    a multi-channel data recovery chopper, said data recovery chopper recovering said digital signal to be transferred to said multi-channel CP;
    a multi-channel programmable delay unit, said programmable delay unit receiving a signal from said CP to be processed with a timing-skew calibration; and
    a random sequence generator, said random sequence generator providing a first random signal and a second random signal.

13. The ADC according to claim 12,
    wherein a number of said phases generated by said multi-phase clock generator is an even number; and wherein said number of said phases is obtained by dividing a sampling period by a timing difference of a phase of said ADC.

14. The ADC according to claim 12, wherein said multi-channel CP comprises a multi-channel zero-crossing detector and a multi-channel co-relater together with accumulators.

15. The ADC according to claim 14, wherein said multi-channel co-relater together with accumulators comprises a co-relater and a plurality of accumulators.

16. The ADC according to claim 15, wherein said accumulator is selected from a group consisting of a flexible-symbol accumulator and a general accumulator.

17. The ADC according to claim 12, wherein said first random signal determines a timing change.

18. The ADC according to claim 12, wherein said second random signal determines a state selected from a group consisting of a positive state and a negative state.

19. The ADC according to claim 12, wherein said multi-channel ADC has outputs having further high-pass filters to filter offset errors in said multi-channel ADC.

* * * * *